United States Patent
Lee et al.

(10) Patent No.: US 9,105,467 B2
(45) Date of Patent: Aug. 11, 2015

(54) DUMMY CELL ARRAY FOR FIN FIELD-EFFECT TRANSISTOR DEVICE AND SEMICONDUCTOR INTEGRATED CIRCUIT INCLUDING THE DUMMY CELL ARRAY

(71) Applicant: Samsung Electronics Co., Ltd., Suwon-si (KR)

(72) Inventors: Ji-Myoung Lee, Yongin-si (KR); Young-Soo Song, Incheon (KR); Jun-Min Lee, Seoul (KR); Bo-Young Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/487,702

(22) Filed: Sep. 16, 2014

(65) Prior Publication Data

US 2015/0084129 A1     Mar. 26, 2015

(30) Foreign Application Priority Data

Sep. 26, 2013   (KR) .......................... 10-2013-0114684

(51) Int. Cl.

| H01L 27/01 | (2006.01) |
|---|---|
| H01L 27/12 | (2006.01) |
| H01L 31/0392 | (2006.01) |
| H01L 27/02 | (2006.01) |
| H01L 27/088 | (2006.01) |
| H01L 29/66 | (2006.01) |
| H01L 21/8234 | (2006.01) |

(52) U.S. Cl.
CPC .... *H01L 27/0207* (2013.01); *H01L 21/823431* (2013.01); *H01L 27/0886* (2013.01); *H01L 27/1211* (2013.01); *H01L 29/6681* (2013.01)

(58) Field of Classification Search
CPC ..... H01L 27/01; H01L 27/12; H01L 31/0392; H01L 27/0207
USPC ..................................... 257/347, 401
See application file for complete search history.

(56) References Cited

U.S. PATENT DOCUMENTS

| 4,641,279 A | 2/1987 | Kimura et al. |
|---|---|---|
| 5,105,385 A | 4/1992 | Ohtsuka et al. |
| 5,945,702 A * | 8/1999 | Nakanishi ...................... 257/296 |
| 6,185,131 B1 * | 2/2001 | Kouchi ........................ 365/185.2 |
| 8,035,170 B2 | 10/2011 | Inaba |
| 8,219,951 B2 | 7/2012 | Cheng et al. |
| 2003/0107932 A1 * | 6/2003 | Komura ......................... 365/203 |
| 2010/0237420 A1 | 9/2010 | Jang |

(Continued)

FOREIGN PATENT DOCUMENTS

| KR | 10-2010-0129865 A | 12/2010 |
|---|---|---|
| KR | 10-2011-0001806 A | 1/2011 |

*Primary Examiner* — Phuc Dang
(74) *Attorney, Agent, or Firm* — Muir Patent Law, PLLC

(57) ABSTRACT

A semiconductor device includes a substrate; a device area of the substrate, the device area including a plurality of device unit cells; and a dummy cell array arranged around the device area. The dummy cell array includes a plurality of dummy unit cells repeatedly arranged in a first direction and a second direction perpendicular to the first direction, each of the dummy cell unit having a structure corresponding to a device unit cell. The device unit cell includes at least a first transistor in the device area. The structure of the dummy unit cell includes an active area and a gate line. For each dummy unit cell, the active area and the gate line extend beyond a cell boundary that defines the dummy unit cell.

20 Claims, 16 Drawing Sheets

(56) References Cited

U.S. PATENT DOCUMENTS

2011/0164444 A1 * 7/2011 Fukano ............................ 365/51
2011/0195564 A1 8/2011 Liaw et al.
2012/0278781 A1 11/2012 Wann et al.
2012/0292712 A1 11/2012 Baek et al.

* cited by examiner

DUMMY CELL ARRAY FOR FIN FIELD-EFFECT TRANSISTOR DEVICE AND SEMICONDUCTOR INTEGRATED CIRCUIT INCLUDING THE DUMMY CELL ARRAY

CROSS-REFERENCE TO RELATED APPLICATIONS

This application claims priority under 35 U.S.C. §119 to Korean Patent Application No. 10-2013-0114684, filed on Sep. 26, 2013, in the Korean Intellectual Property Office, the disclosure of which is incorporated herein in its entirety by reference.

BACKGROUND

The present disclosure relates to a semiconductor integrated circuit, and more particularly, to a dummy cell array structure that may be used in a semiconductor integrated circuit including a fin field-effect transistor (FinFET) device.

A FinFET or a fin-type transistor is a three-dimensional transistor having a fin structure that protrudes from a substrate. As the entire surface of the protruded fin structure of the FinFET device may be used as a channel area, a sufficient channel length may be provided. Accordingly, a short channel effect may be prevented or reduced, and thus, for example, a current leakage problem in regard to a surface area, which is generated by a short channel effect in a planar type transistor according to the conventional art may be prevented.

As the high integration of semiconductor devices has recently been progressing fast, a layout design of the semiconductor integrated circuit may be time consuming and expensive. In general, a layout design technique based on a standard cell may be used to reduce the time and costs. In a layout design method based on a standard cell, devices such as logic OR gates or logic AND gates which are repeatedly used may be designed as standard cells in advance and stored in a computer system. Then, these standard cells are placed and wired where needed when making a layout design, thereby reducing the time for making the layout design. Typically, when the number of polygons of the layout design is reduced the time and costs may be reduced.

SUMMARY

The present disclosure provides a dummy cell array for a fin field-effect transistor (FET) device and a semiconductor integrated circuit including the dummy cell array, which may be manufactured by uniformly performing semiconductor processes with respect to an entire wafer or an entire substrate so that a semiconductor device having uniform characteristics over an entire integrated circuit may be manufactured.

According to an exemplary embodiment, a semiconductor device includes a substrate; a device area of the substrate, including a plurality of device unit cells; and a dummy cell array arranged around the device area, wherein the dummy cell array includes a plurality of dummy unit cells repeatedly arranged in a first direction and a second direction perpendicular to the first direction, each of the dummy unit cells having a structure corresponding to a device unit cell, wherein the device unit cell includes at least a first transistor in the device area, wherein the structure includes an active area and a gate line, and wherein for each dummy unit cell, the active area and the gate line extend beyond a cell boundary that defines the dummy unit cell.

The dummy unit cells may be arranged in a grid pattern such that an offset between adjacent dummy unit cells is substantially 0 and a distance between the dummy unit cells is substantially 0.

The dummy unit cell may have a rectangular shape.

The active area may extend between a left end and a right end of the cell boundary in the first direction and may be separated from an active area of an adjacent dummy unit cell via a first cutting line disposed at the cell boundary and extending in the second direction.

The dummy unit cell may include a plurality of active fins that extend beyond the cell boundary in the first direction and overlap with the active area and are arranged in parallel to one another in the second direction and at least one non-active fin that is disposed parallel to the plurality of active fins and may extend beyond the cell boundary in the first direction.

The dummy unit cell may include a plurality of additional gate lines extending beyond the cell boundary in the second direction across the active area and arranged in parallel to one another in the first direction, and separated from gate lines of another adjacent dummy unit cell via a second cutting line disposed at the cell boundary and extending in the first direction.

The dummy cell array may be separated into a plurality of partial arrays via an isolation area, and wherein the active area and the gate line are not formed in the isolation area.

The isolation area may include a plurality of fins that extend in the first direction and are arranged in parallel to one another in the second direction.

Patterns having a fixed width and a fixed space may be formed in the dummy unit cell.

The device unit cell may be a standard cell, and the dummy unit cell may have substantially the same active density as the standard cell.

The dummy unit cell may include a plurality of contacts. The plurality of contacts may include a first contact including a portion overlapping with the active area and a second contact overlapping with the gate line.

According to another exemplary embodiment, a semiconductor integrated circuit includes: a device area including a plurality of device unit cells each including at least one Fin field-effect transistor (FinFET); and a dummy cell array that includes a plurality of dummy unit cells and is arranged around the device area, wherein each of the dummy unit cells has a structure corresponding to a device unit cell, wherein the plurality of dummy unit cells are repeatedly arranged in a first direction and a second direction perpendicular to the first direction, and wherein the structure of the dummy unit cell includes an active area and a gate line extend beyond a cell boundary that defines the dummy unit cell.

The device area may include at least one of a memory block, a logic block, and an input/output block, wherein the device unit cell may be a standard cell.

The dummy unit cell may have a rectangular shape, wherein the structure of the dummy unit cell may include a plurality of fins that extend beyond the cell boundary in the first direction and are arranged in parallel to one another in the second direction, wherein the active area is separated from an active area of an adjacent dummy unit cell via a first cutting line disposed at the cell boundary and extending in the second direction, wherein the gate line is separated from a gate line of an adjacent dummy unit cell via a second cutting line disposed at the cell boundary and extending in the first direction.

The dummy cell array may be separated into a plurality of partial arrays via an isolation area where the active area and the gate line are not formed, wherein the isolation area may include a plurality of fins that extend along the first direction and are arranged in parallel to one another in the second direction.

According to still another exemplary embodiment, a semiconductor device includes a substrate including a device area and a dummy cell array disposed around the device area, wherein the device area includes a plurality of standard unit cells arranged in a first direction and a second direction perpendicular to the first direction, and the dummy cell array includes a plurality of dummy unit cells arranged in the first and second directions, each dummy unit cell including an active area extending between a left end and a right end of a boundary of the dummy unit cell in the first direction and a plurality of gate lines spaced apart from each other in the first direction and each gate line extending between a top end and a bottom end of the boundary of dummy unit cell in the second direction.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Figure 1:
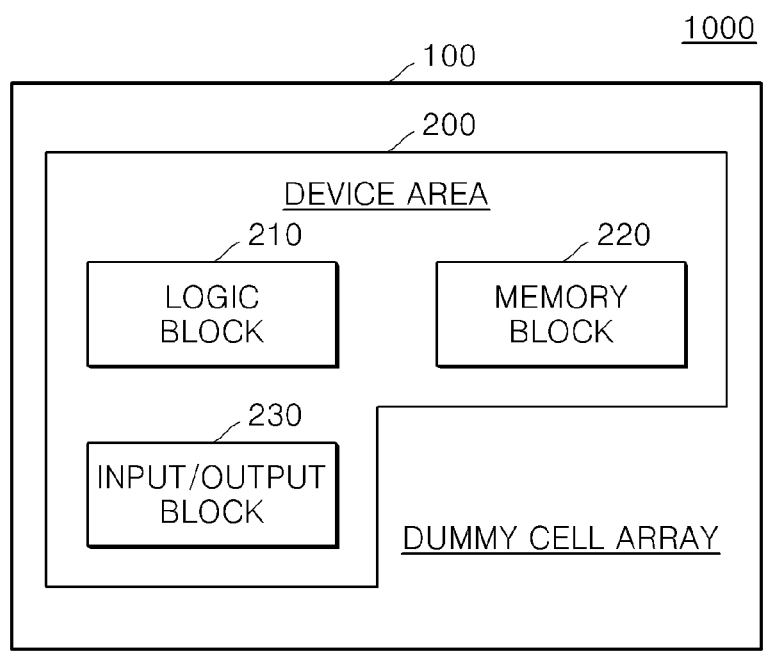
FIG. 1 is a schematic block diagram illustrating a semiconductor integrated circuit according to an embodiment.

Hereinafter, the present disclosure will be described more fully with reference to the accompanying drawings, in which exemplary embodiments of the invention are shown. This disclosure may, however, be embodied in many different forms and should not be construed as limited to the exemplary embodiments set forth herein.

Throughout the specification, it will also be understood that when an element is referred to as being "connected to" another element, it can be directly connected to the other element, or intervening elements may also be present. Similarly, it will also be understood that when an element is referred to as being "on" another element, it can be directly on the other element, or intervening elements may also be present. In contrast, the term "directly" means that there are no intervening elements. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof. Also, in the drawings, the structures or sizes of the elements are exaggerated for clarity, and redundant descriptions thereof are omitted. Like reference numerals denote like elements in the drawings. The terms used herein are for illustrative purpose of the present embodiments only and should not be construed to limit the meaning or the scope of the present disclosure as described in the claims.

The terminology used herein is for the purpose of describing particular embodiments only and is not intended to limit the disclosure. As used herein, the singular terms "a," "an" and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

It will be also understood that although the terms first, second, third etc. may be used herein to describe various elements, these elements should not be limited by these terms. Unless indicated otherwise, these terms are only used to distinguish one element from another element. Thus, a first element in some embodiments could be termed a second element in other embodiments without departing from the teachings of the present invention. Exemplary embodiments of aspects of the present disclosure explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. Thus, the regions illustrated in the figures are schematic in nature and their shapes are not intended to limit the scope of example embodiments.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram illustrating a semiconductor integrated circuit 1000 according to an embodiment.

Referring to FIG. 1, the semiconductor integrated circuit (e.g., a semiconductor device) 1000 includes a dummy cell array 100 and a device area 200.

The device area 200 may be an area where various semiconductor devices are formed. For example, the device area 200 may include a logic block 210, a memory block 220, and an input/output block 230 as illustrated in FIG. 1. The device area 200 may include at least one of the three blocks or more blocks according to a type of the semiconductor integrated circuit 1000. For example, when the semiconductor integrated circuit 1000 is a memory device such as a volatile memory device (e.g., DRAM, SRAM, etc.) or a nonvolatile memory device (e.g., a flash memory, EEPROM, PRAM, RRAM, MRAM, etc.), the device area 200 may include the memory block 220 and the logic block 210 as a controller that controls the memory block 220. The device area may be referred to as a normal area including variable circuits and a plurality of standard cells. The standard cells may be connected to the variable circuits and a power supply voltage for operation.

As the high integration of semiconductor devices has recently been progressing fast, a layout design of the semiconductor integrated circuit 1000, particularly, a layout design of the device area 200, is time consuming and expensive. Accordingly, a layout design technique based on a standard cell may be used to reduce the time and costs. In a layout design method based on a standard cell, devices such as logic OR gates or logic AND gates which are repeatedly used are designed as standard cells in advance and stored in a computer system. Then, these standard cells are placed and wired where needed when making a layout design, thereby reducing the time for making the layout design.

For example, a standard cell may include a basic cell such as an AND, OR, or NOR gate, an inverter, a complex cell such as an OAI (OR/AND/INVERTER) and an AOI (AND/OR/INVERTER), and a storage element such as a simple master-slaver flip-flop and a latch. In addition, a standard cell may include a memory cell such as a DRAM, SRAM, NAND, NOR, MRAM, PRAM, or RRAM cell, etc.

In a standard cell-based layout design method, logic circuit blocks (or cells) having various functions are prepared in advance, and the cells are combined to design a large scale integrated circuit (LSI) that meets the requirements of a customer or a user. The cells may be designed and verified in advance and registered in a computer in advance, and logic designs, arrangement and wiring of logic units may be conducted by combining the registered cells by using a computer aided design (CAD) method.

In detail, when designing or manufacturing an LSI, if standardized logic circuit blocks (or standard cells) of a predetermined size are already stored in a library, the logic circuit blocks suitable for a current design purpose may be output and arranged as a plurality of cells on a chip, and optimal wirings may be realized so that the wiring lengths between cells is the shortest in the wiring space, thereby designing the entire circuit in this manner. As more types of cells are stored in a library, design flexibility may be increased, thereby increasing the possibility of providing an optimally designed chip.

In the semiconductor integrated circuit 1000 according to one embodiment, each of the logic block 210, the memory block 220, and the input/output block 230 of the device area 200 includes multiple transistors such as Fin field-effect transistors (FinFETs), and various semiconductor devices are formed based on the FinFETs. For reference, as a transistor structure has been modified from a planar structure to a FinFET structure, a layout of an active area in the device area 200 has been modified too. For example, in a planar structure, active areas may be separated from one another according to a semiconductor device to be formed. However, in a FinFET structure, active areas may be connected to one another as a single unit in a predetermined direction, for example, in a direction in which the fins extend. The active areas may be separated from one another in a direction in which the gate lines extend.

Also, in the semiconductor integrated circuit 1000, the active areas in the device area 200 may be arranged based on a FinFET structure. Also, integrated circuits formed in the device area 200 may be designed by using the standard cell method described above.

The dummy cell array 100 may be an additional area that is disposed around the device area 200 in order to maintain uniform process conditions with respect to an entire wafer or an entire substrate during a process for forming a semiconductor device (not shown) disposed in the device area 200. Thus, the uniformity and performance of semiconductor devices of the device area 200 may be improved. In one embodiment, the dummy cell array 100 is electrically separated from the semiconductor devices disposed in the device area 200, and thus, may not directly affect the performance of the semiconductor device. For example, the dummy cell array 100 may contribute in forming the device area 200 with a more uniform and functionally improved structure in a front-end-of-line (FEOL) process.

An example regarding the function of the dummy cell array 100 is a chemical mechanical polishing (CMP) process performed on a wafer or a substrate in order to form a globally planarized surface. However, if circuit patterns such as shallow trench isolation (STI) features or metal lines are not uniformly arranged on a wafer or a substrate, a planarizing effect to be provided by the CMP process may be reduced or degraded. Accordingly, in order to improve the effect of the CMP process, dummy patterns may be arranged around the device area 200.

Also, in a typical etching process for patterning, dummy patterns may be formed around the device area 200 like in the CMP process, and accordingly, as uniform etching characteristics are maintained with respect to the entire device area 200, uniform patterns may be implemented in the device area 200.

Meanwhile, during a wafer process or a substrate process, a thermal annealing process may be performed in various stages. For example, after an ion implantation process, a rapid thermal annealing (RTA) operation may be performed in order to reduce defects and to activate doping ions. However, if the entire wafer or the entire substrate is not globally uniform, the effect of thermal annealing may vary according to each position on the wafer or the substrate, and electrical characteristics of devices at the respective positions may vary too. For example, if a thermal annealing temperature is lower or higher than an expected temperature at a predetermined position, a threshold voltage of a FET or a saturated current may deviate from standards. Accordingly, to achieve uniform thermal annealing effects by improving the uniformity of a wafer or a substrate, the dummy patterns may be formed around a device area.

The dummy patterns used in, for example, a CMP process, etching, or a thermal annealing process described above are formed around a device area, and may not be electrically connected to circuits in the device area. Accordingly, the dummy patterns may not perform a direct electrical function with respect to the circuits.

Although FIG. 1 shows the semiconductor integrated circuit 1000 in which the device area 200 protrudes to the right side and the device area 200 is surrounded by the dummy cell array 100, the structure of the semiconductor integrated circuit 1000 is not limited thereto. For example, the device area 200 and the dummy cell array 100 may be arranged in various structures according to electronic devices to be implemented. For example, the device area 200 may be divided into two areas, and the dummy cell array 100 may be disposed to surround a portion between the two portions of the device area 200 and an outer portion of the device area 200.

In the semiconductor integrated circuit 1000 according to one embodiment, the dummy cell array 100 may include dummy patterns that have a similar form and a similar pattern density as patterns of integrated circuits disposed in the device area 200. In one embodiment, the dummy patterns do not electrically connect to other circuits of the semiconductor integrated circuit 1000 and do not operate. In detail, in the semiconductor integrated circuit 1000 according to the current embodiment, integrated circuits may be designed and arranged based on a FinFET structure by using a standard cell method. Also, the dummy cell array 100 may include a dummy pattern that is designed and disposed by using a standard cell method using a dummy unit cell corresponding to a standard cell, and the dummy patterns may have substantially the same form and the same pattern density as the patterns of the integrated circuits of the device area 200. For example, the dummy unit cell may include a basic cell such as an AND, OR, NAND, or NOR gate, an inverter, a complex cell such as an OAI (OR/AND/INVERTER) and an AOI (AND/OR/INVERTER), and a storage element such as a simple master-slaver flip-flop and a latch, but would not operate due to not being provided with a power supply voltage. The dummy cell array 100 will be further described in detail below with reference to FIG. 2A.

In one embodiment, the semiconductor integrated circuit 1000 may be a semiconductor device including the dummy cell array 100 and the device area 200.

Figure 2A:
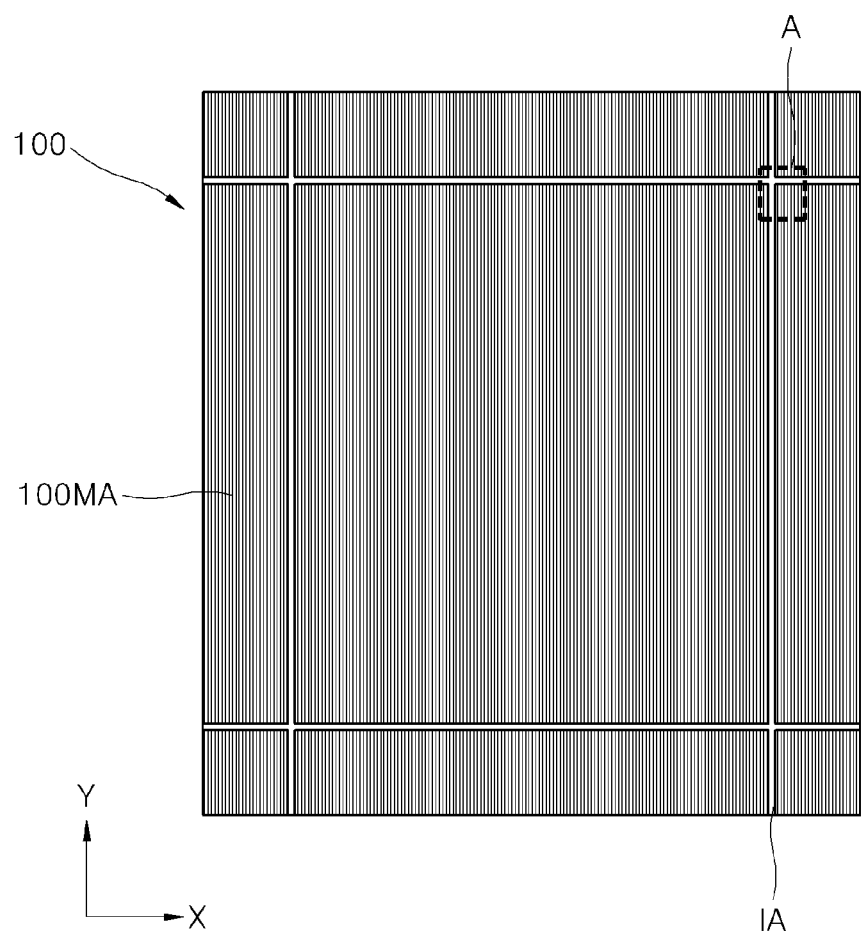
FIG. 2A is a plan view illustrating a dummy cell array according to an embodiment.

FIG. 2A is a plan view illustrating the dummy cell array 100 according to an embodiment.

Referring to FIG. 2A, the dummy cell array 100 may include a plurality of partial arrays 100MA. The partial arrays 100MA may be separated from one another via an isolation area IA, and may each include a plurality of dummy unit cells (not shown).

The dummy unit cells included in the partial array 100MA correspond to standard cells used for designing an integration circuit of the device area 200 (see FIG. 1), and may have a similar pattern form and a similar active density as the standard cells. An active density may be defined as a ratio of an area of fins formed in an active area to an area of the whole fins. If a cutting line for cutting an active area is formed, an area of a portion corresponding to the cutting line may be excluded from the area of the fins formed in the active area. The active density may also be defined in a different way. Details of the dummy unit cells will be further described with reference to FIGS. 4 through 8. For example, the active area may include a channel region and source/drain regions of a FinFET transistor.

The partial array 100MA may be formed by repeatedly arranging dummy unit cells in a first direction (x-direction) and a second direction (y-direction). For example, active areas, fins, and gate lines may be connected to one another in the partial array 100MA. Although cutting lines may be formed between the active areas, the fins, and the gate lines, typically, the active areas, the fins, and the gate lines may be connected to one another in the partial array 100MA.

In one embodiment, the active areas, the fins, and the gate lines are not formed in the isolation area IA. The dummy cell array 100 is separated into the partial arrays 100MA by disposing the isolation area IA in order to prevent a possibility of a pattern collapse as patterns, for example, fins or gate lines, extend very much.

A supporting pattern (not shown) referred to as a supporting mandrel may be formed in the isolation area IA. The supporting pattern may be used in patterning the fins that are formed adjacent to the isolation area IA. For reference, for the fins in the partial array 100MA, nearby adjacent fins have the function of a supporting pattern, and thus, additional supporting patterns do not have to be formed.

Figure 2B:
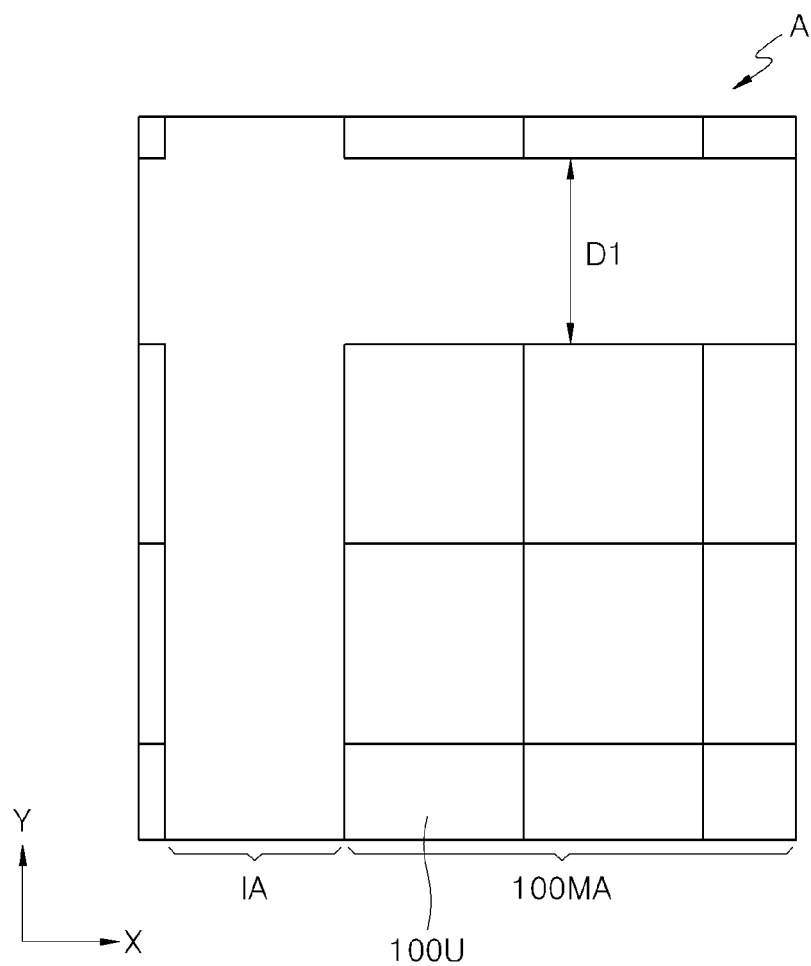
FIG. 2B is an exemplary schematic expanded view of a portion A of the dummy cell array of FIG. 2A to show an isolation area and a partial array.

FIG. 2B is an exemplary schematic expanded view of a portion A of the dummy cell array 100 of FIG. 2A to show the isolation area IA and the partial array 100MA.

Referring to FIG. 2B, the dummy cell array 100 may be separated into some partial arrays 100MA via the isolation area IA. For example, a first width D1 of the isolation area IA in the second direction may be about 1 or less. However, the first width D1 of the isolation area IA is not limited to this value. For example, the partial arrays 100MA may have a width of about 50 in the first direction (x-direction) and/or the second direction (y-direction). However, the width of the partial arrays 100MA is also not limited to the above value.

Each of the partial arrays 100MA may include a plurality of dummy unit cells 100U. Various dummy patterns such as active areas, fins, gate lines, and contacts may be arranged in the dummy unit cells 100U. However, for convenience of description, patterns formed in the dummy unit cells 100U are omitted, and just a schematic form, for example, the dummy unit cells 100U having a rectangular shape, is illustrated. As illustrated in FIG. 2B, the partial arrays 100MA may include a plurality of dummy unit cells 100U that are repeatedly arranged in the first direction (x-direction) and the second direction (y-direction).

Figure 3:
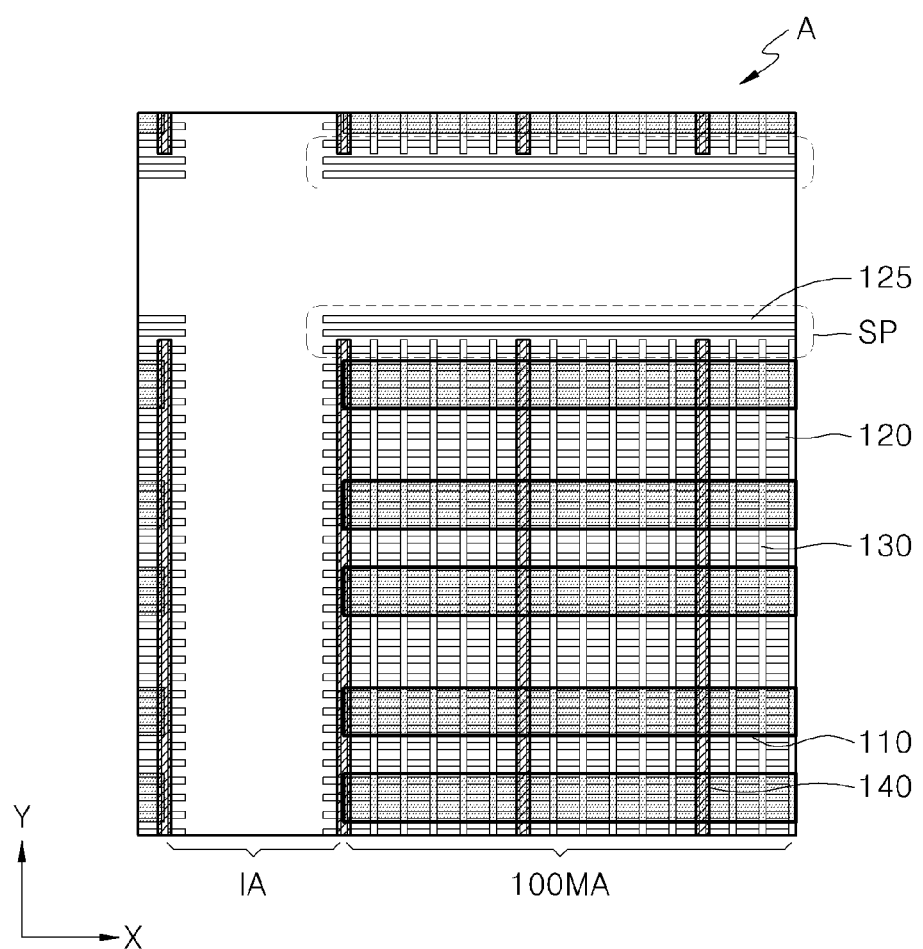
FIG. 3 is an exemplary layout diagram illustrating in more detail a portion of the dummy cell array corresponding to FIG. 2B.

FIG. 3 is an exemplary layout diagram illustrating a portion of the dummy cell array 100 corresponding to FIG. 2B in more detail.

Referring to FIG. 3, the partial array 100MA may include active areas 110, fins 120, and gate lines 130. As illustrated in FIG. 3, the active areas 110, the fins 120, and the gate lines 130 may be each formed as a single body in the partial array 100MA. Alternatively, the active areas 110 and the fins 120 may be separated from each other via a first cutting line 140 for cutting the active areas 110 and the fins 120.

The partial array 100MA may be formed by repeatedly disposing dummy unit cells. Forming of the partial array 100MA will be described with reference to FIGS. 5 and 7.

In one embodiment, a supporting pattern area SP may be disposed adjacent to the isolation area IA outside the partial array 100MA. Supporting patterns 125 may be formed in the supporting pattern area SP. The supporting patterns 125 are used in patterning of, for example, the fins 120 disposed outside the partial array 100MA, as described above. For example, the supporting patterns 125 are used in patterning the fins 120, and thus, extend along the first direction (x-direction) like the fins 120, and may be separated from one another in parallel in the second direction (y-direction).

Figure 4:
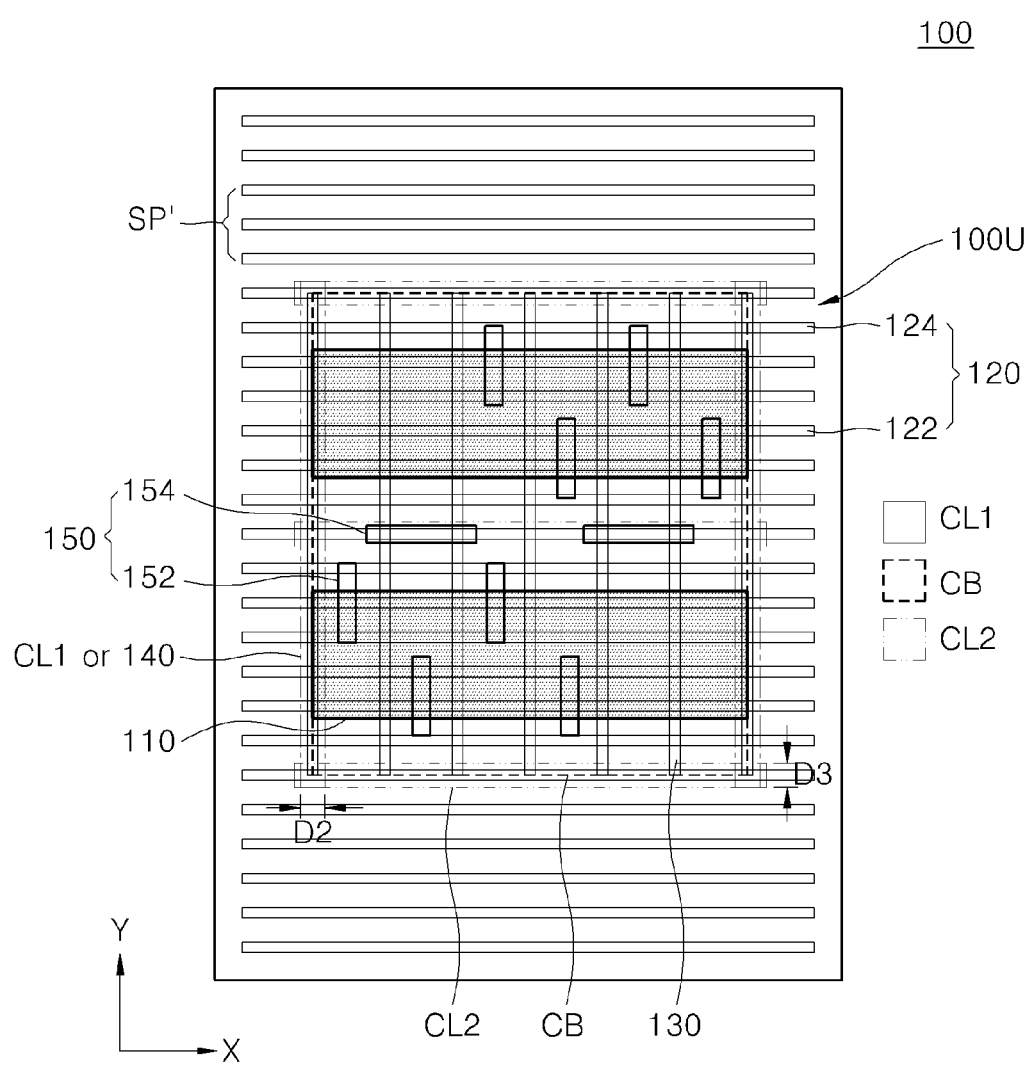
FIG. 4 is an exemplary layout diagram illustrating a dummy unit cell of a dummy cell array according to an embodiment.

FIG. 4 is an exemplary layout diagram illustrating the dummy unit cell 100 according to an embodiment.

Referring to FIG. 4, the dummy unit cell 100U of the dummy cell array 100 may include active areas 110, fins 120, gate lines 130, and contacts 150. The dummy unit cell 100U may be defined by an area surrounded by a cell boundary CB that has a rectangular shape and is denoted by a dotted line.

While two active areas 110 are disposed in the dummy unit cell 100U, the number of the active areas 110 in the dummy unit cell 100U is not limited to two. Also, while each of the active areas 110 has a rectangular shape extending in the first direction (x-direction), the shape of each of the active areas 110 is not limited to a rectangular shape. For example, the active areas 110 may extend in the first direction and may not have the same widths each other, that is, some of the active areas 110 may have different widths.

The active areas 110 may extend upwards to the cell boundary CB of the dummy unit cell 100U. In detail, if a first cutting line CL1 for cutting the active area 110 is formed, the active areas 110 may extend upwards to the first cutting line CL1 or 140. However, if the first cutting line CL1 is not formed, the active areas 110 may extend upwards to the left line or the right line of the cell boundary CB. Also, if the first cutting line CL1 is not formed, when considering other adjacent dummy unit cells 100U, the active areas 110 may extend beyond the cell boundary CB.

In FIG. 4, the active areas 110 is illustrated as corresponding to the left line and the right line of the cell boundary CB, and also, the first cutting line CL1 or 140 is illustrated by an alternate long and short dash line. Although FIG. 4 illustrates the dummy unit cell 100U where the first cutting line CL1 or 140 is not formed, the alternate long and short dash line may be regarded as indicating a provisional position where the first cutting line CL1 or 140 may be formed, for convenience of understanding.

If the first cutting line CL1 or 140 is formed, the active areas 110 may be illustrated as contacting an inner line of the first cutting line CL1 or 140. For example, if the first cutting line CL1 or 140 is formed, and the first cutting line CL1 or 140 has a second width D2, a central line of the first cutting line CL1 or 140 may correspond to the left line or the right line of the cell boundary CB.

The fins 120 may include active fins 122 formed in the active areas 110 and non-active fins 124 formed in a portion other than the active areas 110. With respect to fins formed in a device area, the fins 120 formed in the dummy cell array 100 may be all dummy fins. A plurality of fins 120 may extend in the first direction within the dummy unit cells 100U and may be arranged in parallel in the second direction (y-direction).

The fins 120 may extend up to the cell boundary CB of the dummy unit cell 100U like the active areas 110. Also, as described above, depending on whether the first cutting line CL1 or 140 is formed, as described above, the fins 120 may extend upwards to the first cutting line CL1 or 140, or may extend upwards to the left line or the right line of the cell boundary CB. When the fins 120 extend to the left line or the right line of the cell boundary CB, when considering another adjacent dummy cells 100U, the fins 120 may extend to beyond the cell boundary CB.

Meanwhile, fins of a pseudo supporting pattern area SP' adjacent to the dummy unit cell 100U may function as supporting patterns when fins of the dummy unit cells 100U adjacent to an upper line of the cell boundary CB are patterned, as described above. For example, the fins of the pseudo supporting pattern area SP' may be fins of another dummy unit cells disposed in an upper portion of the dummy unit cells 100U to be adjacent to the dummy unit cells 100U.

A plurality of gate lines 130 extend in the dummy unit cell 100U in the second direction (y-direction) and may be arranged in parallel in the first direction (x-direction). The gate lines 130 may extend upwards to the cell boundary CB of the dummy unit cells 100U. In detail, if a second cutting line CL2 for cutting the gate lines 130 is formed, the gate lines 130 may extend upwards to the second cutting line CL2. However, if the second cutting line CL2 is not formed, the gate lines 130 may extend upwards to an upper line or a lower line of the cell boundary CB. Also, if the second cutting line CL2 is not present, when considering another adjacent dummy unit cell 100U, the gate lines 130 may extend beyond the cell boundary CB.

While the gate lines 130 are illustrated as corresponding to the upper line and the lower line of the cell boundary CB in FIG. 4, and the second cutting line CL2 is illustrated by an alternate long and two short dashes line. Although FIG. 4 illustrates the dummy unit cell 100U when the second cutting line CL2 is not formed, the alternate long and two short dashes line may be regarded as indicating a provisional position where the second cutting line CL2 may be formed, for convenience of understanding.

If the second cutting line CL2 is formed, the gate lines 130 may be illustrated as contacting an inner line of the second cutting line CL2. For example, if the second cutting line CL2 is formed, and the second cutting line CL2 has a third width D3, a central line of the second cutting line CL2 may correspond to an upper line or a lower line of the cell boundary CB. For example, unlike the first cutting line CL1 or 140, the second cutting line CL2 may be formed not only in an outer portion of the dummy unit cell 100U, that is, at the upper line and the lower line of the cell boundary CB, but also in a central portion of the dummy unit cell 100U as illustrated in FIG. 4.

The contacts 150 may include a first contact 152 formed in the active areas 110 and a second contact 154 formed in a non-active area (e.g., a gate line). At least one of the first contact 152 and the second contact 154 may have a double contact structure. For example, the first contact 152 may be a contact that connects a wiring M1, which is an initial wiring of a wiring layer (not shown), and the active area 110, and may have a structure in which a lower contact and an upper contact are stacked. For example, the second contact 154 may be a contact connected to a gate line.

In the dummy cell array 100 according to one embodiment, the dummy unit cell 100U may have a rectangular shape, and may include the active areas 110, fins 120, gate lines 130, and contacts 150. Also, according to a shape of standard cells of the device area 200, the first cutting line CL1 for cutting the active areas 110 may be formed at the left line and the right line of the cell boundary CB of the dummy unit cell 100U, and the second cutting line CL2 for cutting the gate lines 130 may be formed at the upper line and the lower line of the cell boundary CB and across a center of the cell boundary CB.

In one embodiment, patterns disposed in the dummy unit cells 100U, for example, the fins 120 and the gate lines 130, may be arranged with fixed widths and at fixed intervals in the dummy unit cells 100U. This arrangement is based on the concept of a standard cell, and as the widths and the intervals of the fins 120 or the gate lines 130 are fixed, a height or width of standard cells may be determined based on the number and pitches of the fins 120 or the gate lines 130. The standard cell will be described in further detail with reference to FIGS. 13 and 14.

In addition, the dummy unit cell 100U may have substantially the same shape and the same active density as a standard cell of a corresponding device area. However, when a shape of a standard cell is highly complicated or a process difficulty level thereof is high, a dummy unit cell may be easily designed compared to a standard cell in consideration of time and process stability. However, in this case too, the dummy unit cell may be designed to have a similar form and a similar active density as that of a standard cell as much as possible.

As the dummy unit cell 100U is repeatedly arranged in the first direction and the second direction, the dummy cell array 100 may be formed. Accordingly, the dummy cell array 100 may be easily arranged and designed by using a standard cell method. Also, as the dummy cell array 100 has substantially the same pattern form and the same active density as patterns of integrated circuits of a device area, semiconductor processes such as CMP etching, or thermal annealing in a FEOL process may be uniformly performed over the entire wafer or the entire substrate, and thus, functionality and uniformity of a semiconductor device may be improved over all integrated circuits of the device area.

Figure 5:
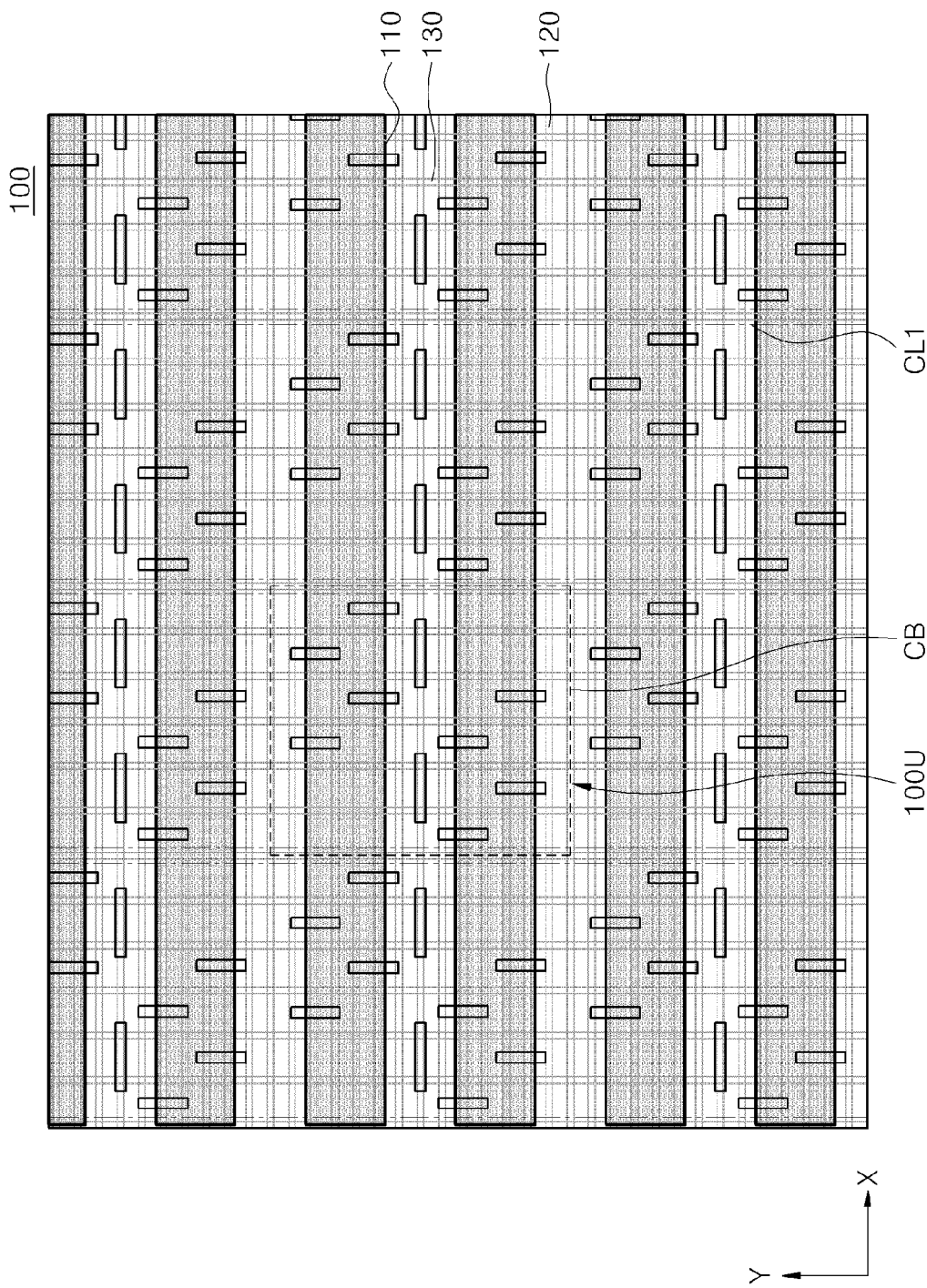
FIG. 5 is an exemplary layout diagram illustrating a dummy cell array formed by repeatedly arranging the dummy unit cell of FIG. 4.

FIG. 5 is an exemplary layout diagram illustrating the dummy cell array 100 by repeatedly arranging the dummy unit cell 100U of FIG. 4.

Referring to FIG. 5, the dummy cell array 100 illustrated in FIG. 5 may be formed by repeatedly arranging the dummy unit cell 100U of FIG. 4 in the first direction (x-direction) and the second direction (y-direction). For example, FIG. 5 only illustrates a portion of the partial array 100MA of the dummy cell array 100 of FIG. 2, and does not illustrate the isolation area IA. Although the first cutting line CL1 is illustrated for convenience of understanding, the second cutting line CL2 is omitted.

The dummy unit cell 100U may be defined by the cell boundary CB denoted by a dotted line. Pitches of the dummy unit cell 100U may correspond to pitches of a standard cell of the device area 200 (see FIG. 1). Also, the dummy unit cells 100U of the dummy cell array 100 may have substantially the same size, and an offset between adjacent dummy unit cells 100U may be 0. For example, as the adjacent dummy unit cells 100U are disposed to share the cell boundary CB, distances between the adjacent dummy unit cells 100U may be 0. Accordingly, if the first cutting line CL1 and/or the second cutting line CL2 is not formed, the active areas 110, the fins 120, and the gate lines 130 may extend beyond the cell boundary CB.

As the dummy cell array 100 is formed of dummy unit cells as described above, the active areas 110, the fins 120, and the gate lines 130 may be connected to one another beyond a cell boundary, and also, the contacts 150 disposed in the dummy unit cells 100U may be repeatedly and uniformly arranged with respect to size and position. Accordingly, the number of polygons corresponding to patterns may be reduced, and also, data may be reduced due to the regular arrangement. Based on reduction in the number of polygons and data reduction, a rule-based optical proximity correction (OPC) may be used. Thus, when designing the dummy cell array 100 and the entire semiconductor integrated circuit, a turn around time (TAT) of OPC may be remarkably reduced. In addition, a photolithography process may be performed easily and effectively based on structural characteristics of patterns and easiness of the OPC.

Figure 6:
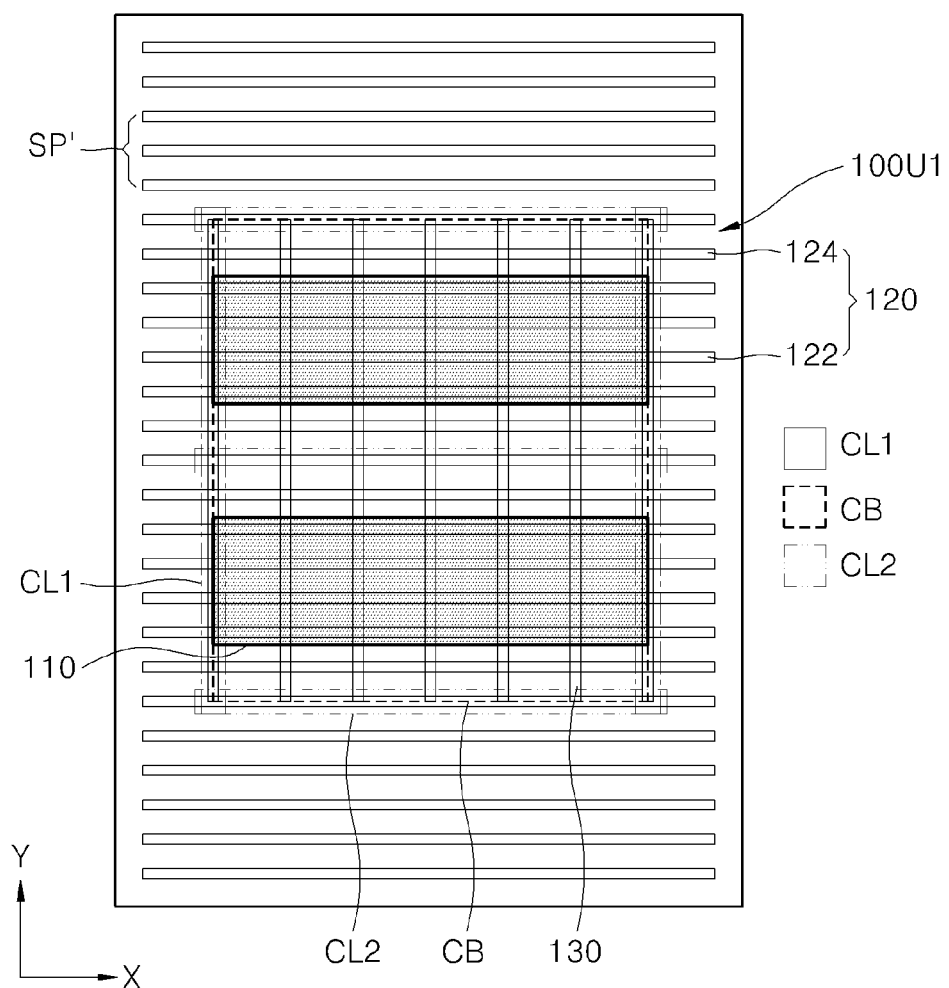
FIG. 6 is an exemplary layout diagram illustrating a dummy unit cell of a dummy cell array according to another embodiment.

FIG. 6 is an exemplary layout diagram illustrating a dummy unit cell 100U1 of a dummy cell array 100-1 according to another embodiment.

Referring to FIG. 6, the dummy unit cell 100U1 of the dummy cell array 100-1 may not include a contact, unlike the dummy unit cell 100U of FIG. 4. For example, a contact may not be formed at all as illustrated in FIG. 6, or according to circumstances, a minimum number of contacts may be formed. As no contact is formed as in certain embodiments, design of the dummy cell array 100-1 may be simplified.

For example, like in the dummy unit cell 100U, the first cutting line CL1 and the second cutting line CL2 may be formed or may not be formed in the dummy unit cell 100U1 according to the current embodiment. Accordingly, when the first cutting line CL1 and/or the second cutting line CL2 are formed, the active areas 110, the fins 120, and the gate lines 130 may extend to contact the first cutting line CL1 and/or the second cutting line CL2. On the contrary, if the first cutting line CL1 and/or the second cutting line CL2 are not formed, the active areas 110, the fins 120, and the gate lines 130 may extend to contact the cell boundary CB of the dummy unit cell 100U1.

Also, when the first cutting line CL1 and/or the second cutting line CL2 are not formed, the active areas 110, the fins 120, and the gate lines 130 may extend beyond the cell boundary CB.

Figure 7:
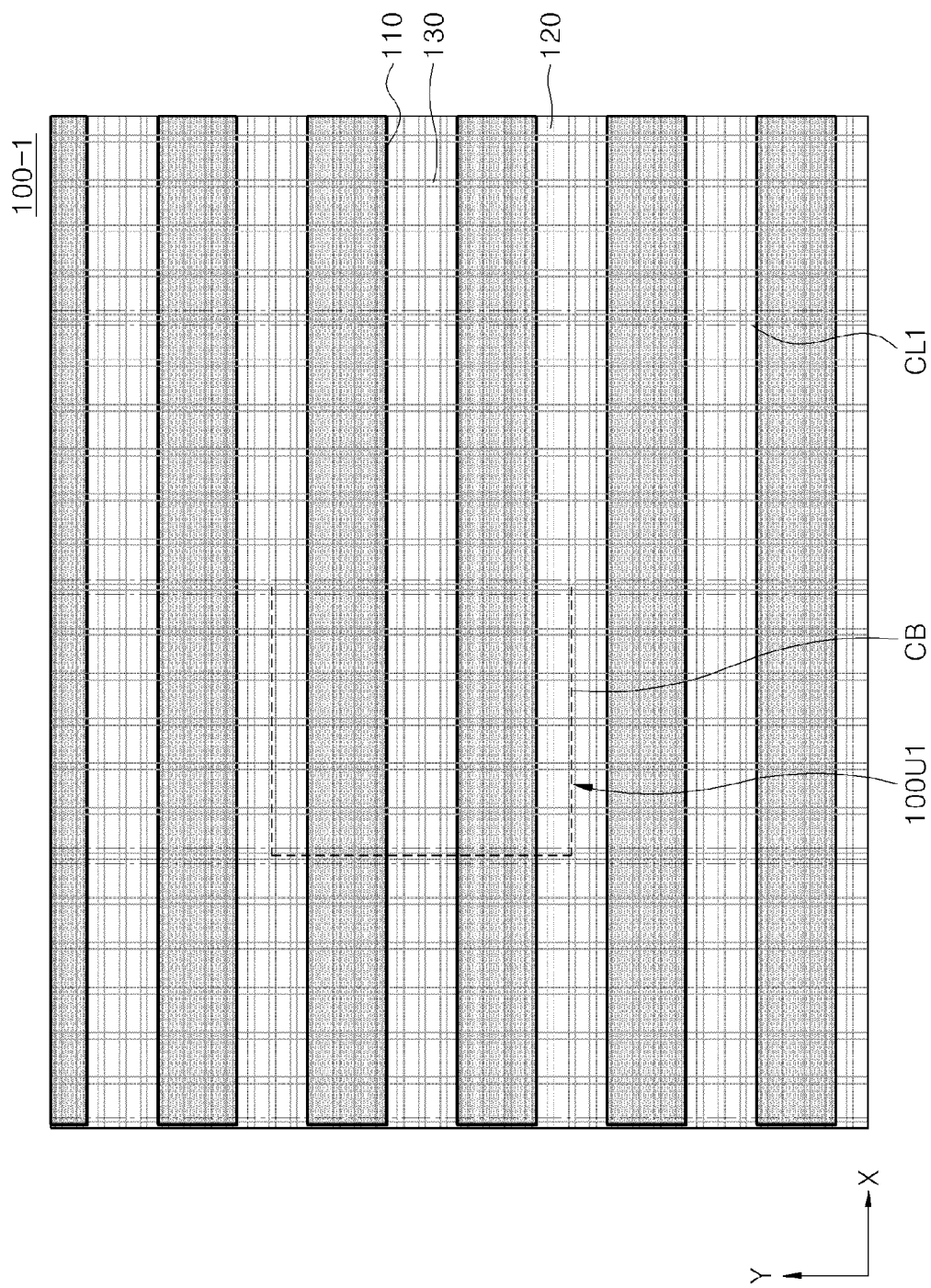
FIG. 7 is an exemplary layout diagram illustrating a dummy cell array formed by repeatedly arranging the dummy unit cell of FIG. 6.

FIG. 7 is an exemplary layout diagram illustrating a dummy cell array formed by repeatedly arranging the dummy unit cell 100U1 of FIG. 6.

Referring to FIG. 7, by repeatedly arranging the dummy unit cells 100UI of FIG. 6 in the first direction (x-direction) and the second direction (y-direction), the dummy cell array 100-1 illustrated in FIG. 7 may be formed. For example, like FIG. 5, FIG. 7 only illustrates a portion corresponding to a partial array and does not illustrate the isolation area IA. Also, only the first cutting line CL1 is illustrated for convenience of understanding, and the second cutting line CL2 is omitted.

The dummy cell array 100-1 may have a similar pattern to that of the partial array 100MA of the dummy cell array 100 illustrated in FIG. 3. However, while the non-active area disposed between the active areas 110 has broad portions and narrow portions in the second direction (y-direction) in the partial array 100MA of FIG. 3, non-active areas between the active areas 110 of the dummy cell array 100-1 may have substantially the same width in the second direction.

Figure 8:
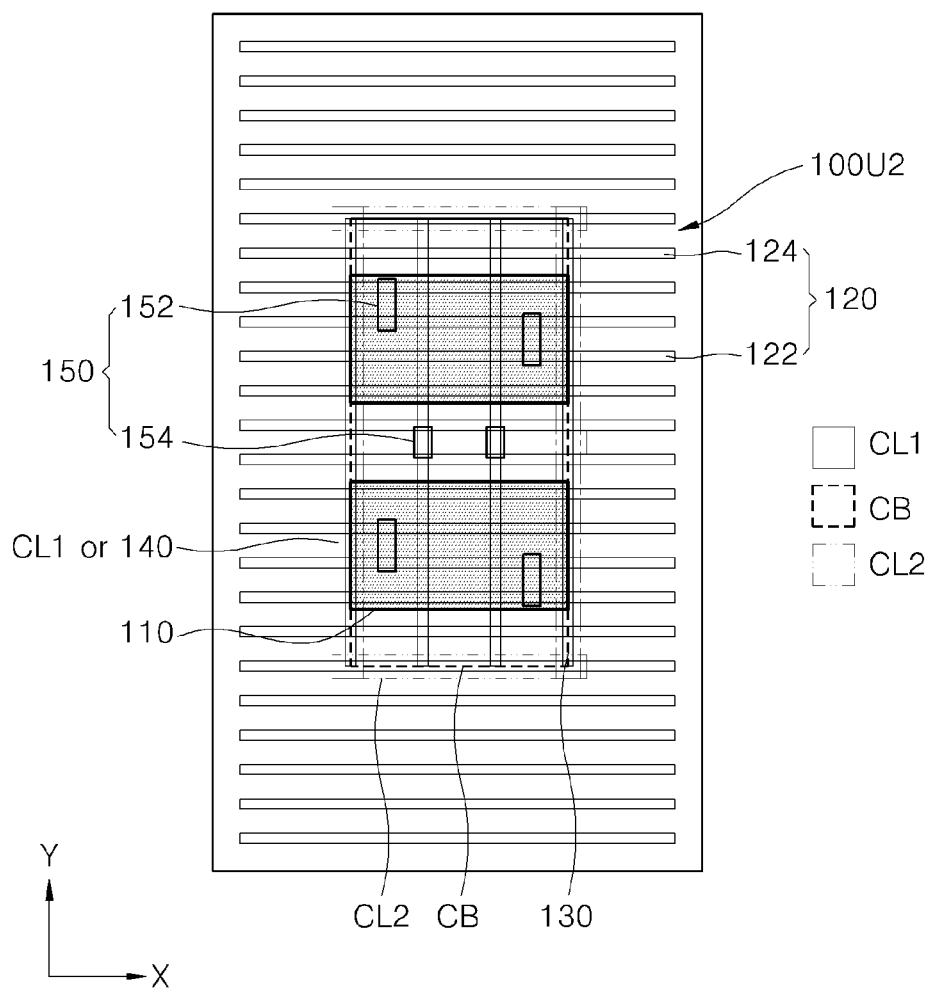
FIG. 8 is an exemplary layout diagram illustrating a dummy unit cell of a dummy cell array according to still another embodiment.

FIG. 8 is an exemplary layout diagram illustrating a dummy unit cell 100U2 of a dummy cell array 100-2 according to still another embodiment.

Referring to FIG. 8, the dummy unit cell 100U2 of the dummy cell array 100-2 may have a relatively narrow width in the first direction (x-direction), unlike the dummy unit cell 100U of FIG. 4. For example, three gate lines 130 may be disposed in the dummy unit cell 100U2 according to one embodiment. The three gate lines 130 may be the result of counting the two gate lines 130 on the left and right lines of the cell boundary CB as a single gate line.

The dummy unit cell 100U2 may correspond to a NAND gate cell of the device area 200 (FIG. 1), and fins in an active area in an upper portion of the dummy cell array 100-2 may form PMOS transistors, and fins of an active area in a lower portion of the dummy cell array 100-2 may form NMOS transistors. The dummy cell array 100-2 may be formed by repeatedly arranging the dummy unit cell 100U2 in the first direction and the second direction as described above. The dummy cell array 100-2 may have a structure corresponding to an integrated circuit formed of a plurality of NAND gates arranged in a device area.

As described above, a dummy unit cell in a dummy cell array may be selected according to a structure of a standard cell for designing an integrated circuit that is disposed in a device area. Accordingly, a structure of a dummy unit cell used in the dummy cell array is not limited to the structures of the dummy unit cell 100, 100-1, or 100-2 illustrated in FIG. 4, 6, or 8, and various dummy unit cell structures may be used according to a standard cell used in a device area.

Figure 9:
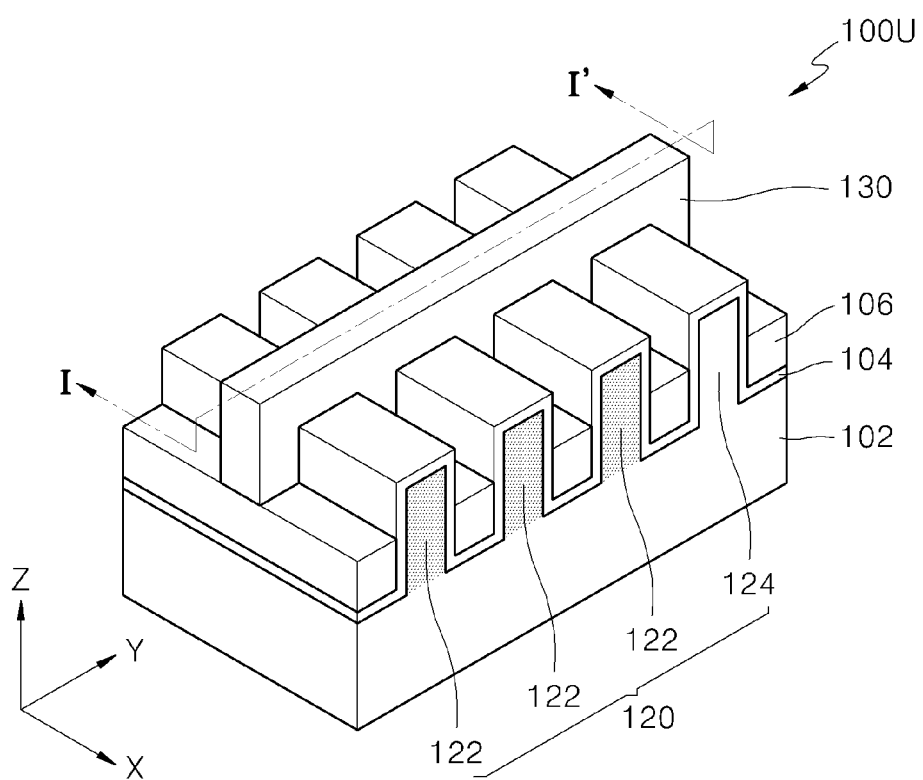
FIG. 9 is a perspective view illustrating a dummy unit cell having a layout as illustrated in FIG. 4 according to an embodiment.
Figure 10:
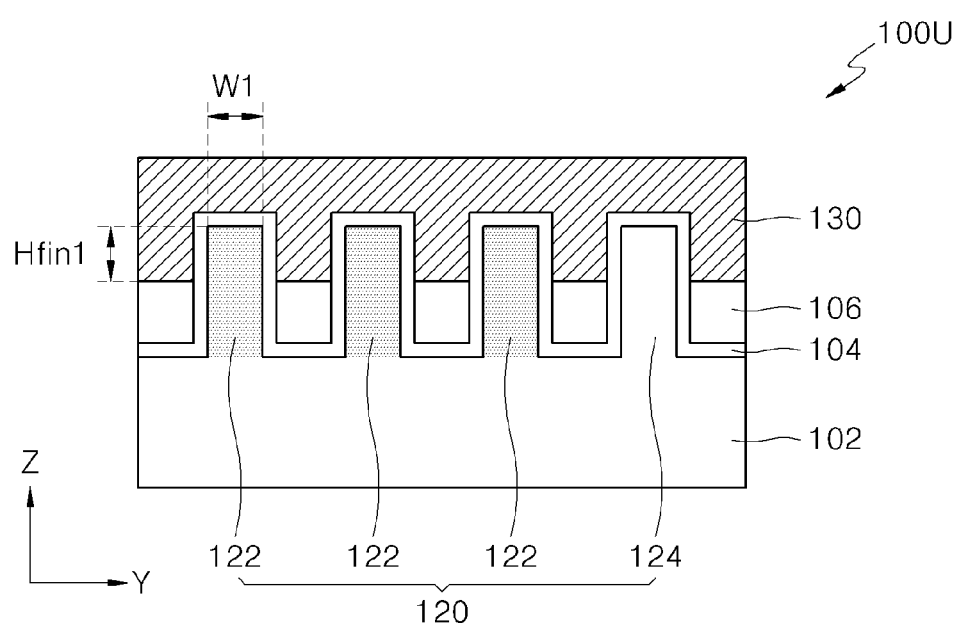
FIG. 10 is an exemplary cross-sectional view illustrating a portion of the dummy unit cell cut along a line I-I' of FIG. 9.

FIG. 9 is a perspective view illustrating a portion of a dummy unit cell having a layout as illustrated in FIG. 4. FIG. 10 is an exemplary cross-sectional view illustrating a portion of the dummy unit cell 100U cut along a line I-I' of FIG. 9.

Referring to FIGS. 9 and 10, the dummy unit cell 100U may include bulk type fins 120. The dummy unit cell 100U may include a substrate 102, a first insulation layer 104, a second insulation layer 106, the fins 120, and a gate line 130. The substrate 102, the first insulation layer 104, the second insulation layer 106, the fins 120, and the gate line 130 disposed in the dummy unit cell 100U may be substantially the same as those components disposed in the standard cell of the device area 200 (FIG. 1).

The substrate 102 may be a semiconductor substrate. For example, the semiconductor substrate may include one of silicon, silicon-on-insulator (SOI), silicon-on-sapphire (SOS), germanium, silicon-germanium, and gallium-arsenide.

The fins 120 may include active fins 122 and at least one non-active fin 124. The active fins 122 and the at least one non-active fin 124 may be connected to the substrate 102 or not connected according to circumstances. According to one embodiment, the active fins 122 may be portions vertically protruding from the substrate 102 and form an active area doped with n+ or p+ ions, and the non-active fin 124 may be a portion that protrudes from the substrate 120 and is not doped.

Each of the active fins 122 may have a width W1 and a height Hfin1. The width W1 and the height Hfin1 of the active fins 122 may respectively correspond to a width and a height of active fins that are formed in the device area 200 (FIG. 1). Accordingly, a channel width (or effective channel width) of the active fins of the device area 200 may be 2*Hfin1+W1. For reference, when a fin transistor is formed of M active fins 122, a channel width of the fin transistor may be (2*Hfin1+W1)*M.

The first and second insulation layers 104 and 106 may include an insulation material. For example, the insulation material may include one of an oxide layer, a nitride layer, and an oxynitride layer. As the first insulation layer 104 is disposed between the active fins 122 and the gate line 130, the first insulation layer 104 may used as a gate insulation layer. The second insulation layer 106 may be disposed to have a predetermined height in space between the active fins 122 and the non-active fin 124. As the second insulation layer 106 is disposed between the active fins 122 and the non-active fin 124, the second insulation layer 106 may be used as device isolation layer.

The gate line 130 may be disposed on the first and second insulation layers 104 and 106. Accordingly, the gate line 130 may thereby surround the active fins 122, the non-active fin 124, and the first insulation layer 104. That is, the active fins 122 and the non-active fin 124 may be disposed in the gate line 130. The gate line 130 may include, for example, a metal such as tungsten (W) or tantalum (Ta), a nitride of these, a silicide of these, or doped polysilicon, and may be formed by using a deposition operation.

By forming the dummy unit cell 100U which is substantially the same as the standard cell of the device area 200 (FIG. 1) described above, patterns disposed in the entire wafer or the entire substrate may be arranged regularly and uniformly. Accordingly, as described above, semiconductor processes such as CMP, etching, and RAT (Rapid thermal annealing) may be uniformly performed over the entire wafer, and thus, functionality and uniformity of integrated circuits of the device area 200 may be improved. In addition, in the dummy cell array 100, the active areas 110, the fins 120, and the gate lines 130 are connected to one another and regularly arranged, and thus, the number of polygons and data may be reduced, and a rule-based OPC may be performed, thereby remarkably reducing a time for the OPC.

Figure 11:
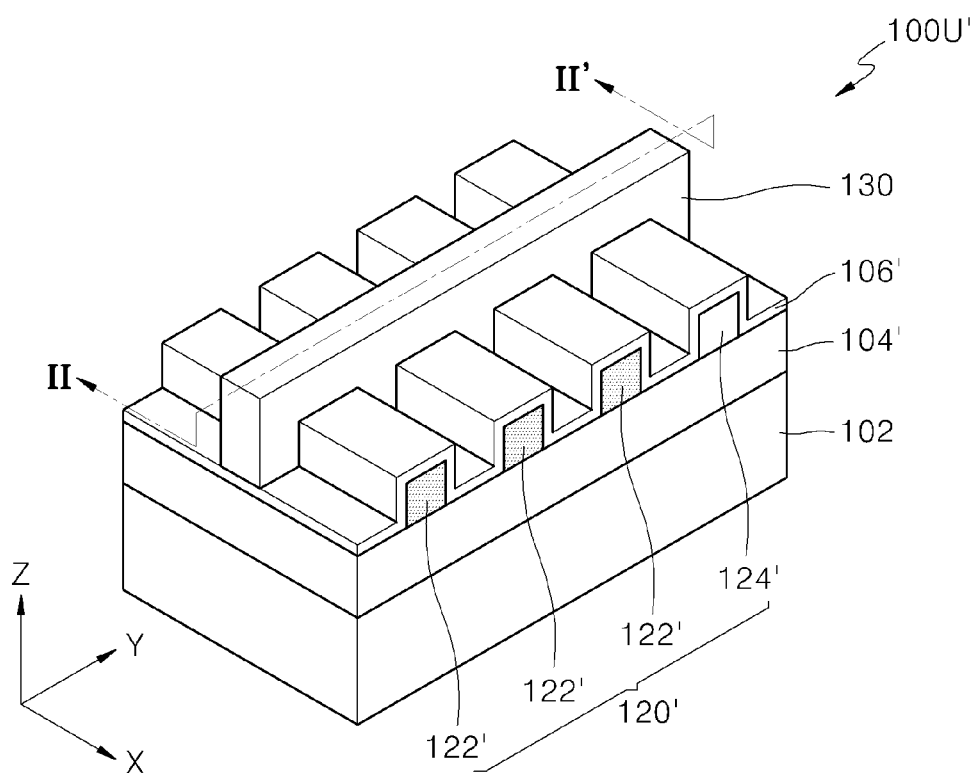
FIG. 11 is a perspective view illustrating a portion of a dummy unit cell having a layout as illustrated in FIG. 4 according to another embodiment.
Figure 12:
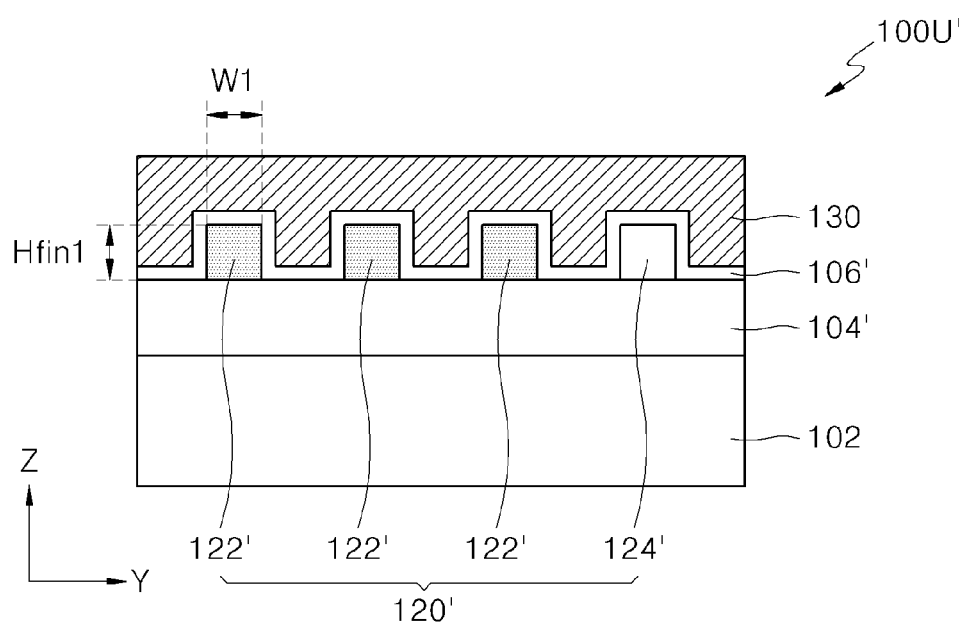
FIG. 12 is an exemplary cross-sectional view illustrating a portion of the dummy unit cell cut along a line II-II' of FIG. 11.

FIG. 11 is a perspective view illustrating a portion of a dummy unit cell 100U' having a layout as illustrated in FIG. 4. FIG. 12 is an exemplary cross-sectional view illustrating a portion of the dummy unit cell 100U' cut along a line II-II' of FIG. 11.

Referring to FIGS. 11 and 12, the dummy unit cell 100U' may include SOI type fins 120'. The dummy unit cell 100U' may include a substrate 102, a first insulation layer 104', a second insulation layer 106', fins 120', and a gate line 130. The substrate 102, the first insulation layer 104', the second insulation layer 106', the fins 120', and the gate line 130 may also be substantially the same as components arranged in the standard cell of the device area 200 (FIG. 1). For example, when a standard cell of a device area is based on the SOI type fins 120', the dummy unit cell 100U' of a dummy cell array may also be formed based on the SOI type fins 120'.

The dummy unit cell 100U' according one embodiment is a modified example of the dummy unit cell 100U, and thus, hereinafter, description will focus on differences from the dummy unit cell 100U of FIGS. 9 and 10. Also, description of the same elements will be omitted.

The first insulation layer 104' may be disposed on the substrate 102. The second insulation layer 106' may be disposed between active fins 122' and non-active fins 124' and the gate line 130 to be used as a gate insulation layer. The gate line 130 may be disposed on the second insulation layer 106'. Accordingly, the gate line 130 may surround the active fins 122', the non-active fins 124', and the second insulation layer 106'. For example, the active fins 122' and the non-active fins 124' may be disposed inside the gate line 130.

Hereinafter, a standard cell corresponding to a dummy unit cell will be briefly explained. A standard cell may be determined based on the number and pitches of metal lines disposed on a cell or based on the number and pitches of fins. Hereinafter, an embodiment in which a height of a standard cell is determined based on the number and pitches of fins will be described with reference to FIGS. 13 and 14. In addition, a difference between an embodiment where a height of a standard cell is determined based on the number and pitches of metal lines and an embodiment where a height of a standard cell is determined based on the number and pitches of fins will be briefly described.

Figure 13:
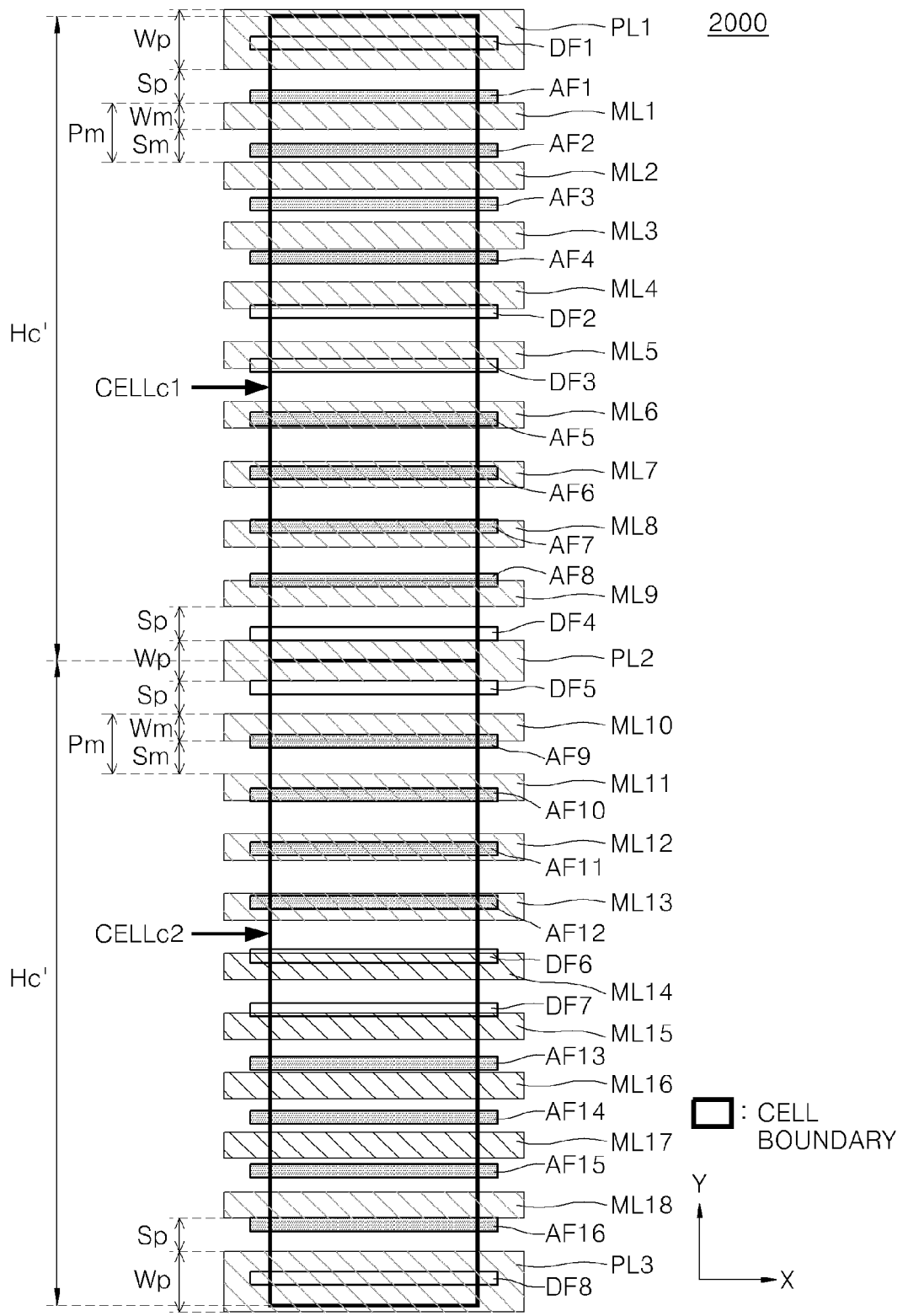
FIGS. 13 and 14 are exemplary layout diagrams illustrating a semiconductor integrated circuit including two adjacent standard cells to explain the concept of a standard cell.
Figure 14:
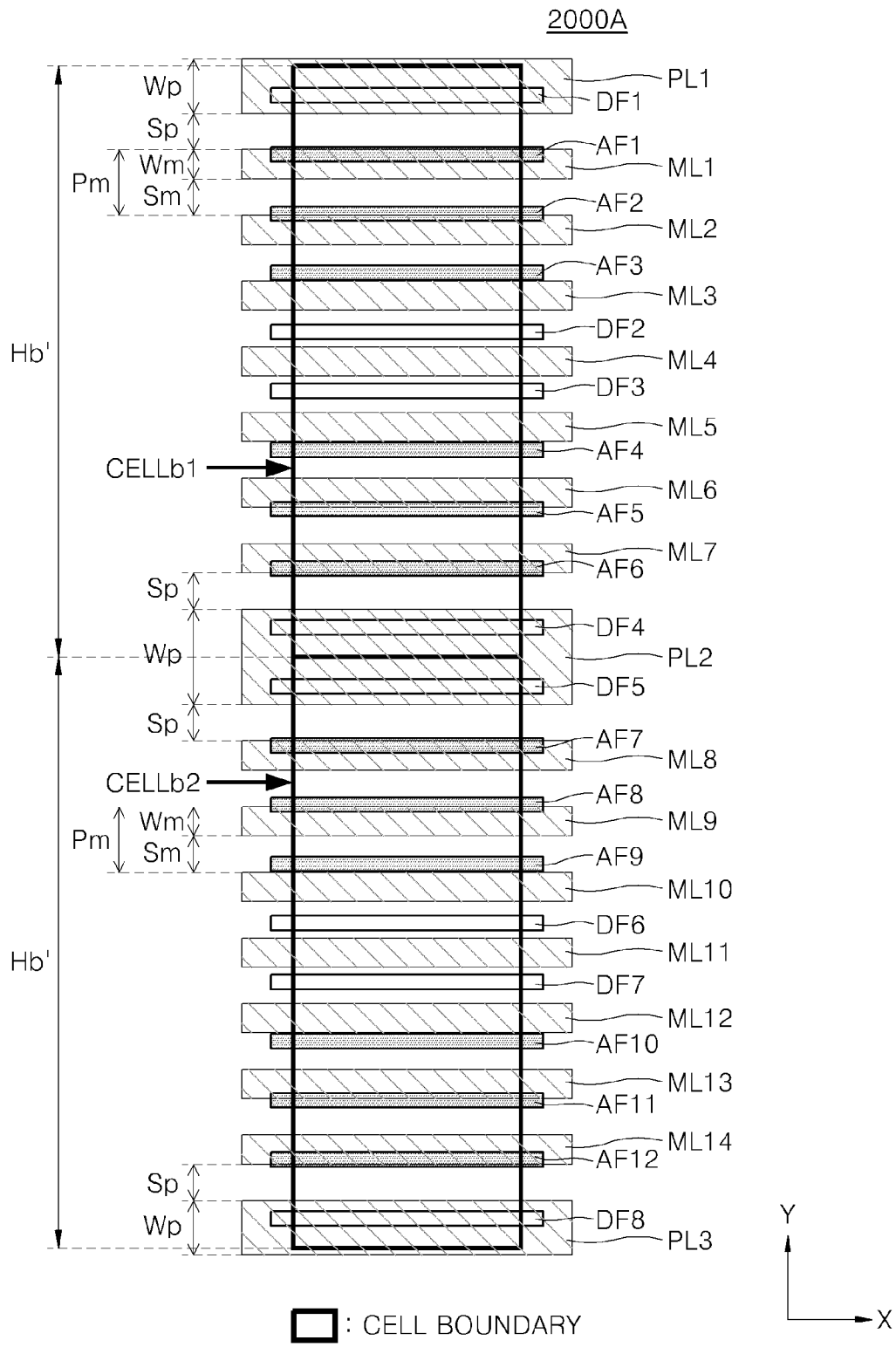

FIGS. 13 and 14 are exemplary layout diagrams illustrating a semiconductor integrated circuit 2000 including two adjacent standard cells in order to explain the concept of a standard cell.

Referring to FIG. 13, the semiconductor integrated circuit 2000 may include first and second standard cells CELLc1 and CELLc2 that are each adjacent to each other and are defined by a cell boundary denoted by a thick solid line. The first standard cell CELLc1 or the second standard cell CELLc2 may correspond to the dummy unit cell 100U, 100U1, or 100U2 illustrated in FIG. 4, 6, or 8.

The first standard cell CELLc1 may include first through eighth active fins AF1 through AF8 and first through fourth non-active fins DF1 through DF4, and a plurality of metal lines (for example, eleven metal lines) may be arranged in the first standard cell CELLc1. The plurality of metal lines may extend in the first direction (x-direction) and may be arranged in parallel to one another in the second direction (y-direction). Also, the plurality of metal lines may include first and second power lines PL1 and PL2 respectively disposed at two ends of the first standard cell CELLc1 in the second direction and first through nine wirings ML1 through ML9 that are disposed between the first and second power lines PL1 and PL2.

The first through ninth wirings ML1 through ML9 may have a width Wm, and a space between two adjacent wirings among the first through the ninth wirings ML1 through ML9 is Sm, and thus, a pitch of the first through ninth wirings ML1 through ML9 is Wm+Sm. For example, the width Wm of each of the first through ninth wirings ML1 through ML9, the space Sm between two adjacent wirings from among the first through ninth wirings ML1 through ML9, and the pitch Pm of the first through ninth wirings ML1 through ML9 may be uniform regardless of the number of wirings or the number of metal lines included in the first standard cell CELLc1.

A first power line PL1 may be arranged over a boundary between the first standard cell CELLc1 and another cell adjacently disposed on the first standard cell CELLc1, and a second power line PL2 may be arranged over a boundary between the first and second standard cells CELLc1 and CELLc2. A width Wp of each of the first and second power lines PL1 and PL2 may be greater than the width Wm of each of the first through ninth wirings ML1 through ML9.

Also, the width Wp of each of the first and second power lines PL1 and PL2 may be variable according to a size of the first standard cell CELLc1 in the second direction, that is, a height Hc'. In detail, the width Wp of each of the first and second power lines PL1 and PL2 may be determined according to a size obtained by subtracting from the height Hc' of the first standard cell CELLc1 a size corresponding a product of the number of the first through ninth wirings ML1 through ML9 multiplied by the pitch Pm.

A space Sp between the first power line PL1 and the first wiring ML1 may be substantially the same as the space Sm between two adjacent lines from among the first through ninth wirings ML1 through ML9. Also, a space Sp between the second power line PL2 and the ninth wiring ML9 may be substantially the same as the space Sm between two adjacent wirings from among the first through ninth wirings ML1 through ML9.

The second standard cell CELLc2 may include ninth through sixteenth active fins AF9 through AF16 and fifth through eighth non-active fins DF5 through DF8, and a plurality of metal lines (for example, eleven metal lines) may be arranged on the second standard cell CELLc2. The plurality of metal lines may extend along the first direction (x-direction) and may be arranged in parallel to one another in the second direction (y-direction). Also, the plurality of metal lines may include second and third power lines PL2 and PL3 that are respectively arranged at two ends of the second standard cell CELLc2 in the second direction and tenth through eighteenth wirings ML10 through ML18 disposed between the second and third power lines PL2 and PL3.

Pitches of wirings of the second standard cell CELLc2, widths of the second and third power lines PL2 and PL3, and spaces Sp between the second power line PL2 and the tenth wiring ML10 or between the third power line PL3 and the eighteen wiring ML18 are as described above with reference to the first standard cell CELLc1.

As described above, the heights Hc' of the first and second standard cells CELLc1 and CELLC2 may be determined based on the number Nc and a pitch Pc' of a plurality of active fins and a plurality of dummy fins, and the pitch Pc' may have a uniform value regardless of the number Nc of the plurality of active fins and the plurality of dummy fins. Also, a pitch Pm of wirings disposed on the first and second standard cells CELLc1 and CELLc2 may have a uniform value regardless of the number of wirings, and a width Wp of the power lines may be adaptively determined based on the heights Hc' of the first and second standard cells CELLc1 and CELLc2.

Referring to FIG. 14, a semiconductor integrated circuit 2000A may include adjacent first and second standard cells CELLb1 and CELLb2 that are each defined by a cell boundary denoted by a thick solid line.

The first standard cell CELLb1 may include first through sixth active fins AF1 through AF6 and first through fourth non-active fins DF1 through DF4, and a plurality of metal lines (for example, nine metal lines) may be disposed on the first standard cell CELLb1. Also, the plurality of metal lines may include first and second power lines PL1 and PL2 that are respectively arranged at two ends of the first standard cell CELLb1 in the second direction and first through seventh wirings ML1 through ML7 disposed between the first and second power lines PL1 and PL2.

The first through ninth wirings ML1 through ML9 may have a width Wm, and a space between two adjacent wirings among the first through the ninth wirings ML1 through ML9 is Sm, and thus, a pitch Pm of the first through ninth wirings ML1 through ML9 is Wm+Sm. The width Wm of each of the first through ninth wirings ML1 through ML9, the space Sm between two adjacent wirings from among the first through ninth wirings ML1 through ML9, and the pitch Pm of the first through ninth wirings ML1 through ML9 may be uniform regardless of the number of the wirings or the number of metal lines included in the first standard cell CELLc1.

The first power line PL1 may be arranged over a boundary between the first standard cell CELLc1 and another cell adjacently disposed on the first standard cell CELLb1, and the second power line PL2 may be arranged over a boundary between the first and second standard cells CELLb1 and CELLb2. A width Wp of each of the first and second power lines PL1 and PL2 may be greater than the width Wm of the first through seventh wirings ML1 through ML7.

Also, the width Wp of each of the first and second power lines PL1 and PL2 may be variable according to a size of the first standard cell CELLb1 in the second direction, that is, a height Hb'. In detail, the width Wp of each of the first and second power lines PL1 and PL2 may be determined according to a size obtained by subtracting, from the height Hb' of the first standard cell CELLb1, a size corresponding a product of the number of the first through seventh wirings ML1 through ML7 multiplied by the pitch Pm.

For example, a space Sp between the first power line PL1 and the first wiring ML1 may be substantially the same as the space Sm between two adjacent lines from among the first through seventh wirings ML1 through ML7. Also, a space Sp between the second power line PL2 and the seventh wiring ML7 may be substantially the same as the space Sm between two adjacent wirings from among the first through seventh wirings ML1 through ML7.

The second standard cell CELLb2 may include seventh through twelfth active fins AF7 through AF12 and fifth through eighth dummy fins DF5 through DF8, and a plurality of metal lines (for example, nine metal lines) may be arranged on the second standard cell CELLb2. Also, the plurality of metal lines may include second and third power lines PL2 and PL3 that are respectively arranged at two ends of the second standard cell CELLb2 in the second direction and eighth through fourteenth wirings ML8 through ML14 disposed between the second and third power lines PL2 and PL3.

A pitch of wirings of the second standard cell CELLb2, a width of the second and third power lines PL2 and PL3, and space Sp between the second power line PL2 and the eighth wiring ML8 or between the third power line PL3 and the fourteenth wiring ML14 are as described above with reference to the first standard cell CELLb1.

As described above, the heights Hb' of the first and second standard cells CELLb1 and CELLb2 may be determined based on the number N and a pitch Pb' of a plurality of active fins and a plurality of dummy fins, and the pitch Pb' may have a uniform value regardless of the number N of the plurality of active fins and the plurality of dummy fins. Also, a pitch Pm of wirings disposed on each of the first and second standard cells CELLb1 and CELLb2 may have a uniform value regardless of the number of wirings, and a width Wp of the first and second power lines P1 and P2 may be adaptively determined based on the heights Hb' of the first and second standard cells CELLb1 and CELLb2.

Although eleven or nine metal wirings have been described above, more or less metal wirings may be used. Also, although the above-described—embodiment shows that a standard cell is determined based on the number and pitch of fins, a standard cell may also be determined based on the number and pitch of metal lines and the number of fins may be determined and disposed according to the standard cell. A height of the standard cell determined based on the number and pitch of fins may be relatively small compared to an embodiment in which a standard cell is determined based on the number and pitch of metal lines, and accordingly, an integration degree may be improved.

In detail, for example, when a height of a standard cell is determined based on eight metal lines, and a pitch of metal lines is 45, the height of the standard cell may be determined as 8*45=360. If a minimum pitch that is allowed for a plurality of active fins and a plurality of non-active fins is 40.5, eight fins may be included in a standard cell. That is, an inequality of 40.5*8≤360 may be established. Accordingly, eight fins may be arranged in a standard cell at a pitch of 45.

In one embodiment, when considering an embodiment in which a height of a standard cell is determined based on the number and pitch of fins, as described above, when eight metal lines are included, it may be determined that eight fins may be included, and when fins are arranged with a minimum pitch, the height of the standard cell may be 40.5*8=324. Accordingly, if the same metal lines are included, and a standard cell is determined based on the number and pitch of fins, the height of the standard cell may be further reduced, and accordingly, an integration degree of a semiconductor integrated circuit may be improved.

For example, a width of a standard cell may also be determined similarly to the height of the standard cell based on the number and pitch of gate lines.

Figure 15:
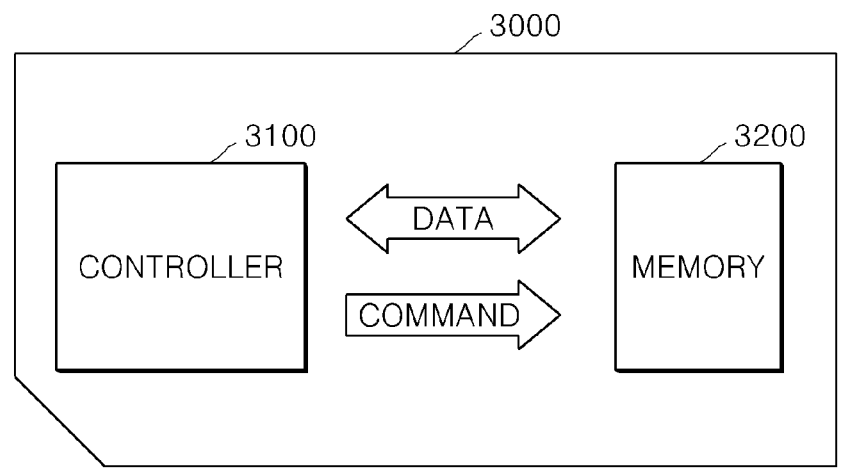
FIG. 15 is a schematic view illustrating a memory card including a semiconductor integrated circuit according to certain embodiments.

FIG. 15 is a schematic view illustrating a memory card 3000 including a semiconductor integrated circuit according to certain embodiments.

Referring to FIG. 15, a controller 3100 and a memory 3200 are arranged in the memory card 3000 to exchange electrical signals. For example, if the controller 3100 outputs a command, the memory 3200 may transmit data.

At least one of the controller 3100 and the memory 3200 may include a semiconductor integrated circuit. In detail, the semiconductor integrated circuit of the at least one of the controller 3100 and the memory 3200 may include a dummy cell array formed based on a dummy unit cell corresponding to the standard cell as illustrated in FIG. 4, 6, or 8, around a device area.

Examples of the memory card 3000 may include, for example, a memory stick card, a smart media card (SM), a secure digital card (SD), a mini-secure digital card (mini SD), and a multimedia card (MMC).

Figure 16:
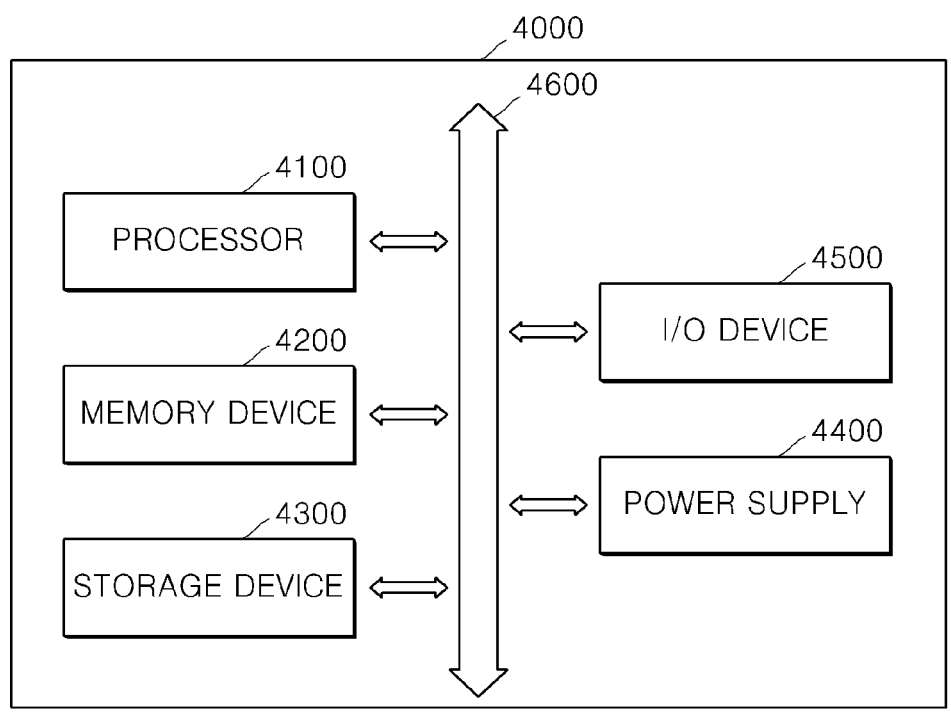
FIG. 16 is a schematic view illustrating a computing system including a semiconductor integrated circuit according to certain embodiments.

FIG. 16 is a schematic view illustrating a computing system 4000 including a semiconductor integrated circuit according to certain embodiments.

Referring to FIG. 16, the computing system 4000 includes, a processor 4100, a memory device 4200, a storage device 4300, a power supply 4400, and an input/output device 4500. For example, although not illustrated in FIG. 16, the computing system 4000 may further include ports for communication with a video card, a sound card, a memory card, or a universal serial bus (USB) device or other electronic appliances.

As described above, at least one of the processor 4100, the memory device 4200, the storage device 4300, the power supply 4400, and the input/output device 4500 of the computing system 4000 may include a semiconductor integrated circuit. In detail, the integrated circuit of the at least one of the processor 4100, the memory device 4200, the storage device 4300, the power supply 4400, and the input/output device 4500 may include a dummy cell array formed based on a dummy unit cell corresponding to a standard cell as illustrated in FIG. 4, 6, or 8.

The processor 4100 may perform predetermined computations or tasks. According to an embodiment, the processor 4100 may be a micro-processor or a central processing unit (CPU). The processor 4100 may communicate with the memory device 4200, the storage device 4300, and the input/output device 4500 via a bus 4600 such as an address bus, a control bus, and a data bus. According to an embodiment, the processor 4100 may also be connected to an extension bus such as a peripheral component interconnect (PCI) bus.

The memory device 4200 may store data needed for operation of the computing system 4000. For example, the memory device 4200 may be a dynamic random access memory (DRAM), a mobile DRAM, a static RAM (SRAM), a phase-change RAM (PRAM), a ferroelectric RAM (FRAM), a resistive RAM (RRAM), and/or a magnetic RAM (MRAM). The storage device 4300 may include, for example, a solid state drive, a hard disk drive, or a CD-ROM.

The input/output device 4500 may include an input unit such as a keyboard, a keypad, or a mouse and an output unit such as a printer or a display. The power supply 4400 may supply an operating voltage needed for operation of the computing system 4000.

The semiconductor integrated circuit according to the embodiments described above may be implemented as a package in various forms. For example, at least a portion of the semiconductor integrated circuit may be mounted by using a package such as a Package on Package (PoP), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), or a Wafer-Level Processed Stack Package (WSP).

While the disclosure has been particularly shown and described with reference to exemplary embodiments thereof, it will be understood that various changes in form and details may be made therein without departing from the spirit and scope of the following claims.

What is claimed is:

1. A semiconductor device, comprising:
    a substrate;
    a device area of the substrate, the device area including a plurality of device unit cells; and
    a dummy cell array arranged around the device area,
    wherein the dummy cell array comprises a plurality of dummy unit cells repeatedly arranged in a first direction and a second direction perpendicular to the first direction, each of the dummy unit cells having a structure corresponding to a device unit cell,
    wherein the device unit cell includes at least a first transistor in the device area,
    wherein the structure of the dummy unit cell includes an active area and a gate line, and
    wherein for each dummy unit cell, the active area and the gate line extend beyond a cell boundary that defines the dummy unit cell.

2. The semiconductor device of claim 1, wherein the dummy unit cells are arranged in a grid pattern such that an offset between adjacent dummy unit cells is substantially 0 and a distance between the dummy unit cells is substantially 0.

3. The semiconductor device of claim 1, wherein the dummy unit cell has a rectangular shape.

4. The semiconductor device of claim 3, wherein the active area extends between a left end and a right end of the cell boundary in the first direction and is separated from an active area of an adjacent dummy unit cell via a first cutting line disposed at the cell boundary and extending in the second direction.

5. The semiconductor device of claim 3, wherein the dummy unit cell further includes a plurality of active fins that extend beyond the cell boundary in the first direction and overlap with the active area and are arranged in parallel to one another in the second direction, and at least one non-active fin that is disposed parallel to the plurality of active fins and extends beyond the cell boundary in the first direction.

6. The semiconductor device of claim 3, wherein the dummy unit cell further includes a plurality of additional gate lines extending beyond the cell boundary in the second direction across the active area and arranged in parallel to one another in the first direction, and separated from gate lines of another adjacent dummy unit cell via a second cutting line disposed at the cell boundary and extending in the first direction.

7. The semiconductor device of claim 1, wherein the dummy cell array is separated into a plurality of partial arrays via an isolation area, and
    wherein the active area and the gate line are not formed in the isolation area.

8. The semiconductor device of claim 7, wherein the isolation area includes a plurality of fins that extend in the first direction and are arranged in parallel to one another in the second direction.

9. The semiconductor device of claim 1, wherein the first transistor is a Fin field-effect transistor (FinFET).

10. The semiconductor device of claim 1, wherein the device unit cell is a standard cell, and the dummy unit cell has substantially the same active density as the standard cell.

11. The semiconductor device of claim 1, wherein the dummy unit cell further comprises a first contact including a portion overlapping with the active area and a second contact overlapping with the gate line.

12. A semiconductor integrated circuit comprising:
    a device area comprising a plurality of device unit cells each including at least one Fin field-effect transistor (FinFET); and
    a dummy cell array that comprises a plurality of dummy unit cells and is arranged around the device area,
    wherein each of the dummy unit cells has a structure corresponding to a device unit cell,
    wherein the plurality of dummy unit cells are repeatedly arranged in a first direction and a second direction perpendicular to the first direction, and
    wherein the structure of the dummy unit cell includes an active area and a gate line extend beyond a cell boundary that defines the dummy unit cell.

13. The semiconductor integrated circuit of claim 12, wherein the device area comprises at least one of a memory block, a logic block, and an input/output block, and
    wherein the device unit cell is a standard cell.

14. The semiconductor integrated circuit of claim 12,
    wherein the structure of the dummy unit cell further includes a plurality of fins that extend beyond the cell boundary in the first direction and are arranged in parallel to one another in the second direction,
    wherein the active area is separated from an active area of an adjacent dummy unit cell via a first cutting line disposed at the cell boundary and extending in the second direction, and
    wherein the gate line is separated from a gate line of an adjacent dummy unit cell via a second cutting line disposed at the cell boundary and extending in the first direction.

15. The semiconductor integrated circuit of claim 12, wherein the dummy cell array is separated into a plurality of partial arrays via an isolation area where the active area and the gate line are not formed, and
    wherein the isolation area includes a plurality of fins that extend along the first direction and are arranged in parallel to one another in the second direction.

16. A semiconductor device, comprising:
    a substrate including a device area and a dummy cell array disposed around the device area,
    wherein the device area includes a plurality of standard unit cells arranged in a first direction and a second direction perpendicular to the first direction, and the dummy cell array includes a plurality of dummy unit cells arranged in the first and second directions, each dummy unit cell including an active area extending between a left end and a right end of a boundary of the dummy unit cell in the first direction and a plurality of gate lines spaced apart from each other in the first direction and each gate line extending between a top end and a bottom end of the boundary of dummy unit cell in the second direction.

17. The semiconductor device of claim 16, wherein each dummy unit cell further includes a plurality of fins spaced apart from each other in the second direction, each fin extending between the left end and the right end of the boundary of dummy unit cell in the first direction.

18. The semiconductor device of claim 17, wherein the dummy cell array includes a first dummy cell sub-array having a plurality of first dummy unit cells and a second dummy cell sub-array having a plurality of second dummy unit cells, the first and second first dummy cell sub-arrays separated by an isolation region, and wherein the isolation region is disposed between the first dummy cell sub-array and the second dummy cell sub-array, and includes at least a first fin extending in the first direction and disposed adjacent to a second fin of the first dummy cell sub-array or the second dummy cell sub-array.

19. The semiconductor device of claim 16, wherein the boundary of dummy cell unit is a rectangular shape.

20. The semiconductor device of claim 16, wherein the dummy unit cell corresponds to the standard unit cell.

* * * * *